(12) United States Patent
Kanki et al.

(10) Patent No.: US 8,691,699 B2
(45) Date of Patent: Apr. 8, 2014

(54) MANUFACTURING METHOD OF SEMICONDUCTOR DEVICE AND SEMICONDUCTOR DEVICE

(75) Inventors: Tsuyoshi Kanki, Atsugi (JP); Shoichi Suda, Machida (JP); Shinya Sasaki, Ebina (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/427,200

(22) Filed: Mar. 22, 2012

(65) Prior Publication Data

US 2012/0273964 A1    Nov. 1, 2012

(30) Foreign Application Priority Data

Apr. 8, 2011    (JP) ................. 2011-086422

(51) Int. Cl.
*H01L 21/311*    (2006.01)
(52) U.S. Cl.
USPC .......................................... 438/697; 257/774
(58) Field of Classification Search
USPC .......... 257/532, 536, 700, 774, 773, E21.545, 257/E21.546, 758; 438/106, 118, 597, 618, 438/622, 687, 629, 672, 123, 613
See application file for complete search history.

(56) References Cited

U.S. PATENT DOCUMENTS

| | | | | |
|---|---|---|---|---|
| 5,334,804 A | * | 8/1994 | Love et al. | 174/267 |
| 5,396,034 A | * | 3/1995 | Fujita et al. | 174/261 |
| 6,396,153 B2 | | 5/2002 | Fillion et al. | 257/774 |
| 7,833,893 B2 | * | 11/2010 | Grunow et al. | 438/597 |
| 2004/0195692 A1 | * | 10/2004 | Adan | 257/758 |
| 2005/0224968 A1 | * | 10/2005 | Ho | 257/737 |
| 2006/0105565 A1 | | 5/2006 | Liu et al. | |
| 2007/0224795 A1 | | 9/2007 | Chen et al. | |
| 2009/0121353 A1 | | 5/2009 | Ramappa et al. | |
| 2009/0179317 A1 | | 7/2009 | Iida et al. | |
| 2009/0206484 A1 | | 8/2009 | Baker-O'Neal et al. | |

FOREIGN PATENT DOCUMENTS

| | | |
|---|---|---|
| CN | 1790663 | 6/2006 |
| JP | 2001-351923 | 12/2001 |
| JP | 2004-014629 | 1/2004 |
| JP | 2009-64954 | 3/2009 |
| JP | 2009-170492 | 7/2009 |
| KR | 10-2010-0127756 | 12/2010 |

OTHER PUBLICATIONS

Korean Office Action dated Oct. 11, 2013 in Korean Patent Application No. 10-2013-0086128.
Korean Office Action dated Nov. 28, 2013 in Korean Patent Application No. 10-2012-0035906.
Chinese Office Action dated Jan. 13, 2014 in Chinese Patent Application No. 201210104837.1.

* cited by examiner

*Primary Examiner* — Steven Loke
*Assistant Examiner* — Mouloucoulaye Inoussa
(74) *Attorney, Agent, or Firm* — Staas & Halsey LLP

(57) ABSTRACT

A manufacturing method of a semiconductor device includes: forming an insulating layer above a substrate; forming a recessed section in the insulating layer; forming, on the insulating layer, a mask pattern having a first opening which exposes the recessed section, and a second opening which is arranged outside the first opening and does not expose the recessed section; forming a first conductive member and a second conductive member by respectively depositing a conductive material in the first opening and the second opening; and polishing and removing the first conductive member and the second conductive member on the upper side of the insulating layer so as to leave the first conductive member in the recessed section.

12 Claims, 17 Drawing Sheets

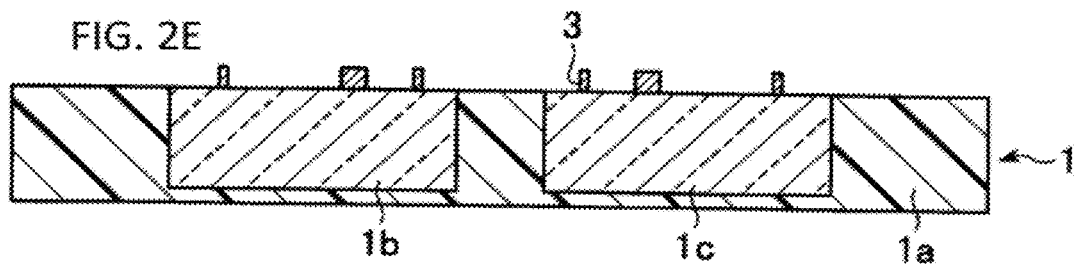
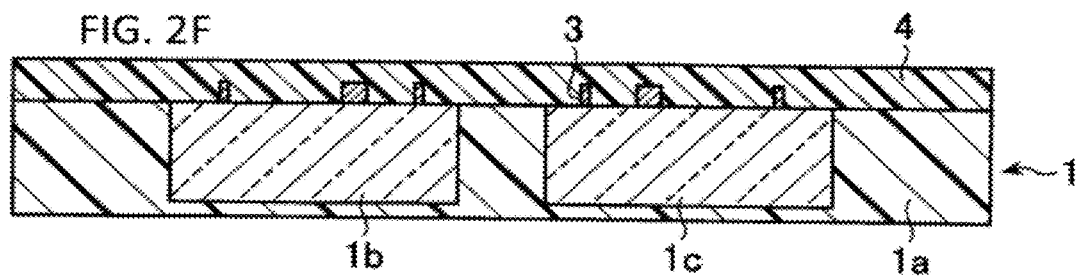
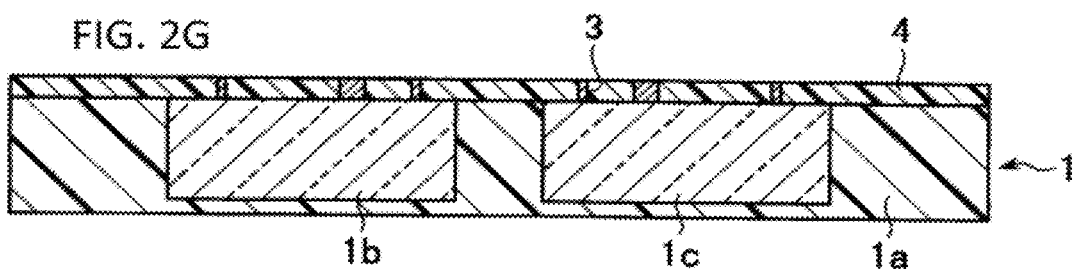
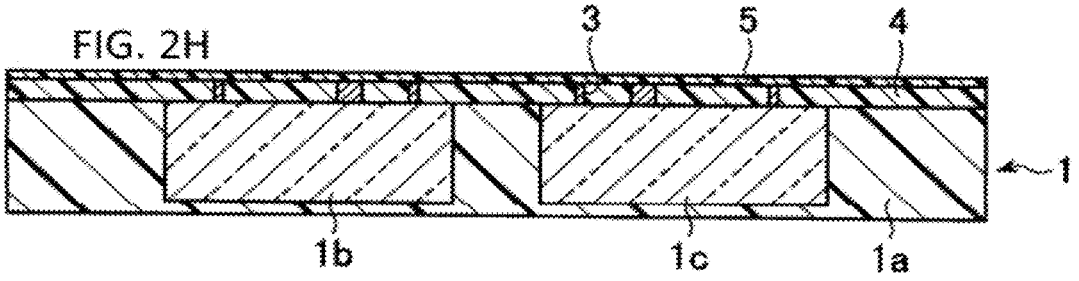

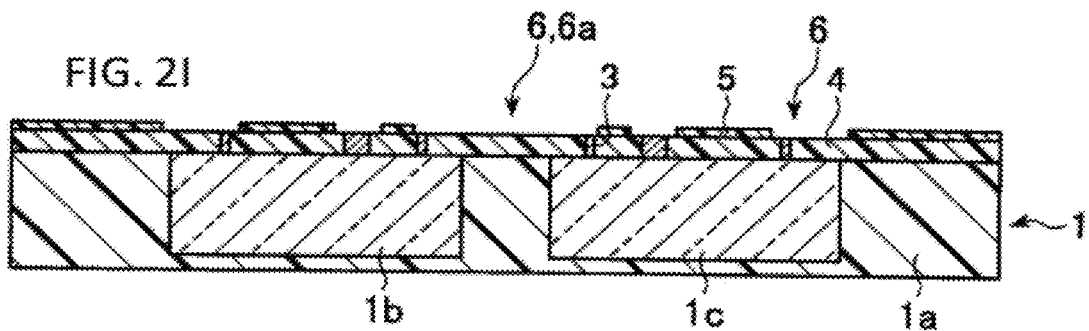
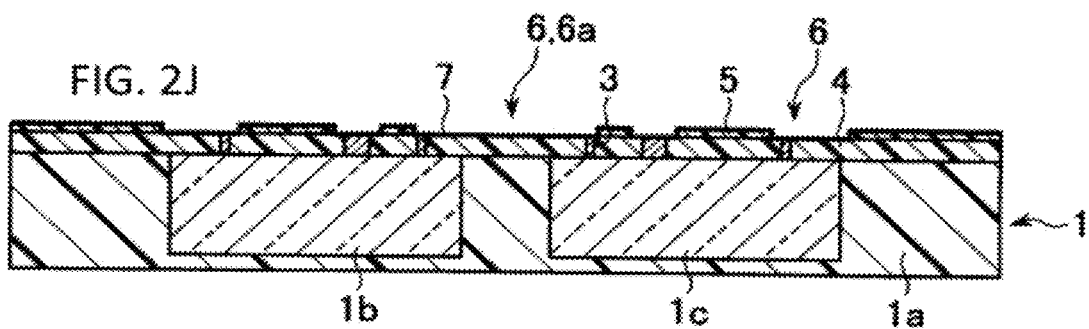
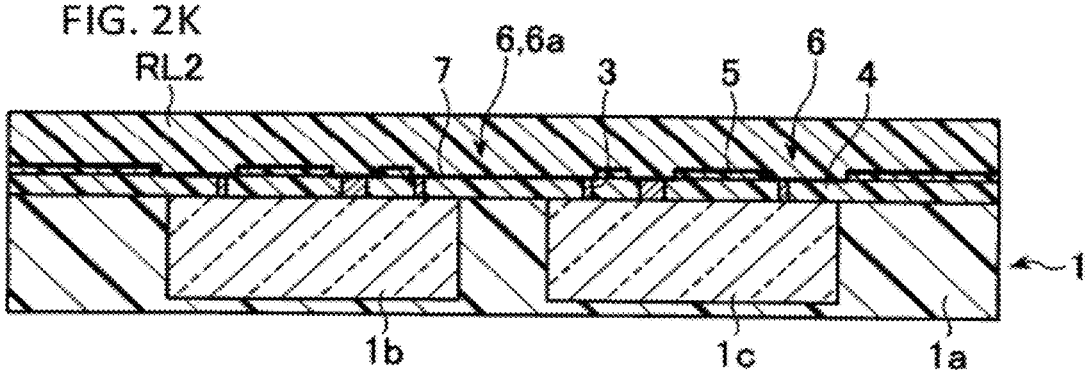
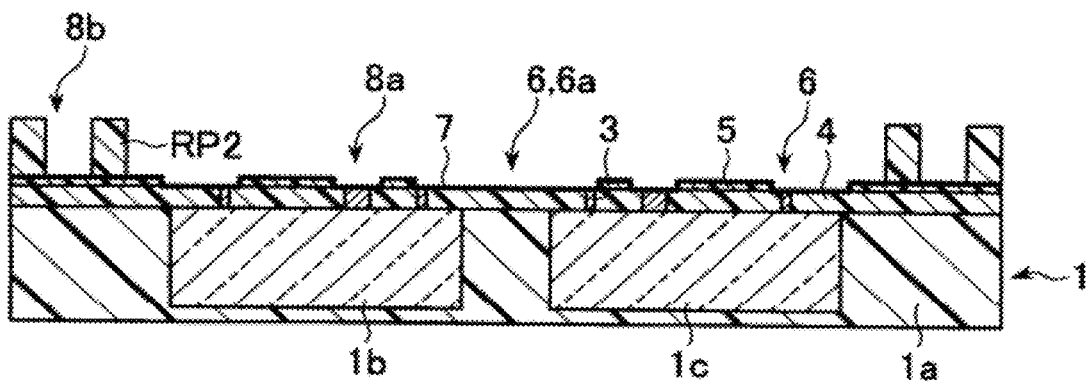

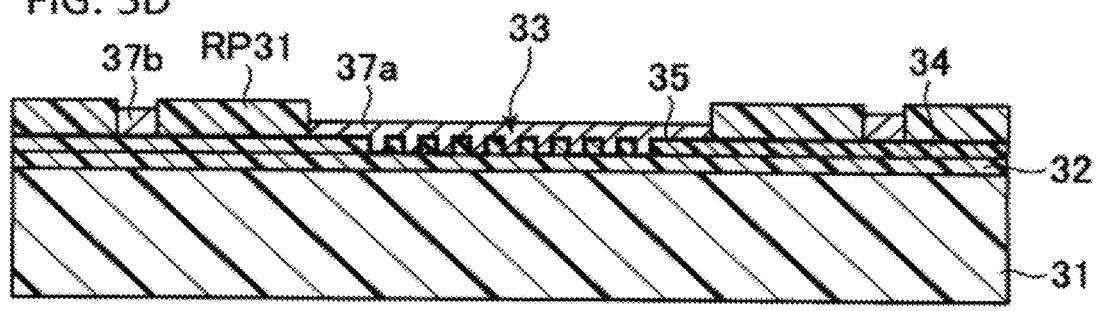
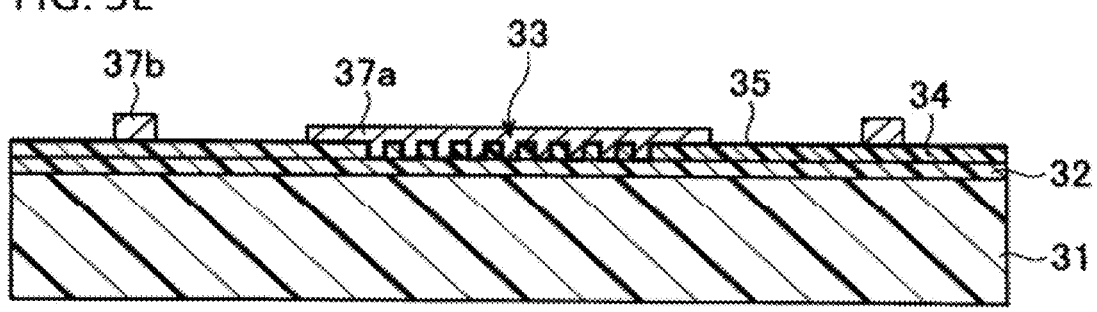
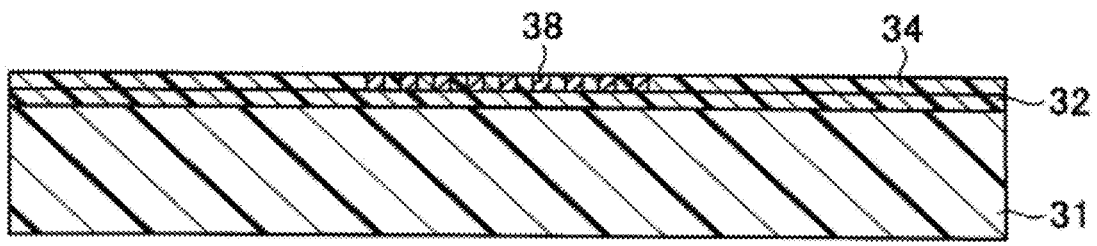

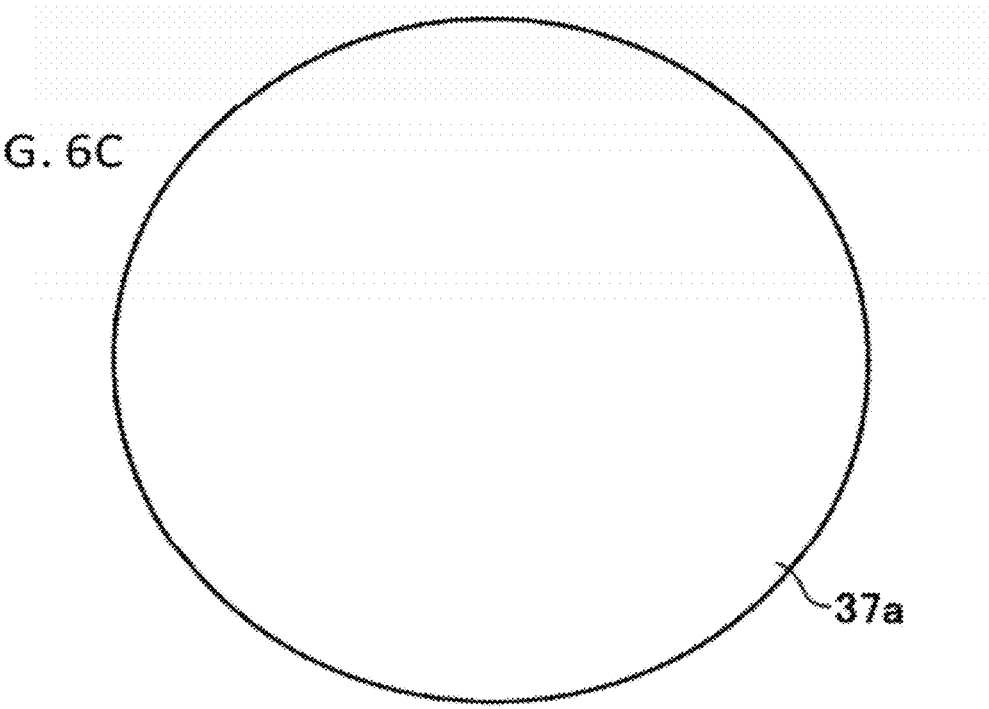
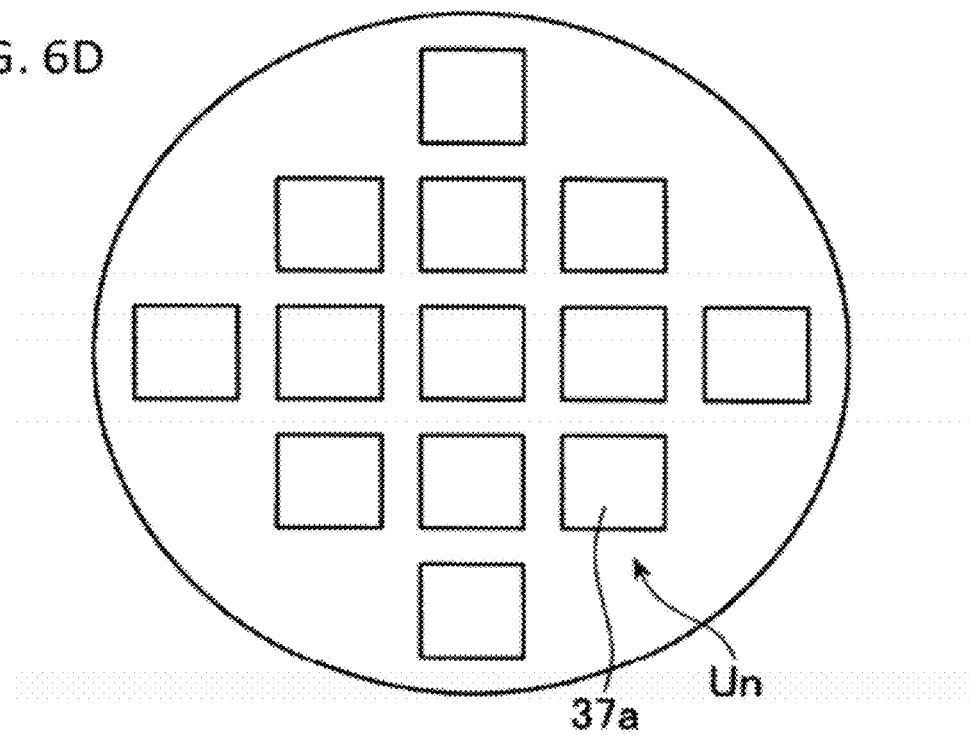

MANUFACTURING METHOD OF SEMICONDUCTOR DEVICE AND SEMICONDUCTOR DEVICE

CROSS REFERENCE TO RELATED APPLICATION

This application is based upon and claims the benefit of priority from the prior Japanese Patent Application NO. 2011-0086422 filed on Apr. 8, 2011, the entire contents of which are incorporated herein by reference.

FIELD

The embodiments disclosed hereafter are related to a manufacturing method of a semiconductor device and to a semiconductor device.

BACKGROUND

In recent years, in accordance with the requests of size reduction, high performance, and cost reduction of electronic devices, the miniaturization and multilayering of a circuit board with semiconductor chips mounted thereon, and the high density mounting of electronic components on the circuit board have been advanced along with the miniaturization and increase in terminals of each of the semiconductor chips.

Circuit boards have been diversified into various kinds and have become complicated. As represented by a pseudo system on chip (SOC) technique, there has been studied a technique which integrally forms a circuit by using a substrate that is formed by sealing with resin a plurality of semiconductor chips having different characteristics. In the pseudo SOC technique, a rewiring layer, which includes a wiring portion, and the like, for electrically connecting the adjacent semiconductor chips to each other, is formed on a reconstructed wafer with the plurality of semiconductor chips embedded therein.

Various techniques have been developed as techniques for forming a pattern of a metallic material.
Patent Document 1: Japanese Laid-Open Patent Publication No. 2009-64954
Patent Document 2: Japanese Patent No. 4543089
Patent Document 3: Japanese Laid-Open Patent Publication No. 2001-351923

SUMMARY

According to an aspect of the embodiments, there is provided a manufacturing method of a semiconductor device including: forming an insulating layer above a substrate; forming a recessed section in the insulating layer; forming, on the insulating layer, a mask pattern having a first opening which exposes the recessed section, and a second opening which is arranged outside the first opening and does not expose the recessed section; forming a first conductive member and a second conductive member by respectively depositing a conductive material in the first opening and the second opening; and polishing and removing the first conductive member and the second conductive member on the upper side of the insulating layer so as to leave the first conductive member in the recessed section.

BRIEF DESCRIPTION OF THE DRAWINGS

FIG. 2E to FIG. 2H are schematic sectional views depicting main processes of the manufacturing method of the pseudo SOC wafer according to the embodiment;

FIG. 2I to FIG. 2L are schematic sectional views depicting main processes of the manufacturing method of the pseudo SOC wafer according to the embodiment;

FIG. 5D to FIG. 5F are schematic sectional views depicting main processes of the manufacturing method of the sample in the first experiment;

FIG. 6C and FIG. 6D are schematic plan views of comparison samples in the first experiment;

DESCRIPTION OF EMBODIMENTS

A manufacturing method of a pseudo SOC wafer according to an embodiment of the present invention will be described.

First, a schematic structure of a pseudo SOC wafer manufactured by a method of the present embodiment is described with reference to FIG. 1A to FIG. 1C.

Figure 1A:
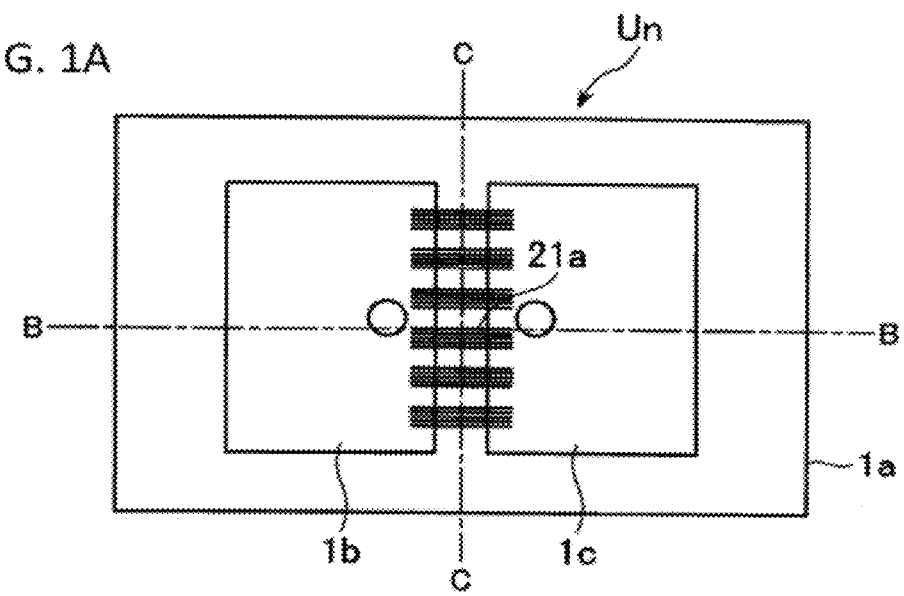
FIG. 1A is a schematic plan view of a pseudo SOC wafer according to an embodiment.
Figure 1B:
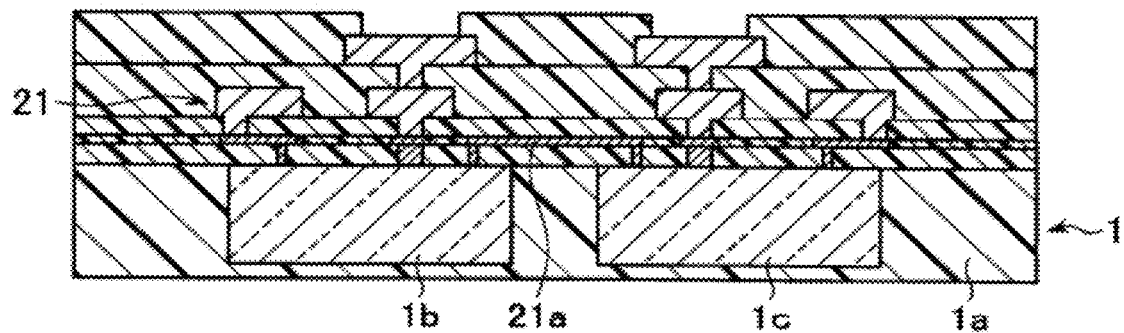
FIG. 1B and FIG. 1C are schematic sectional views of the pseudo SOC wafer according to the embodiment.
Figure 1C:
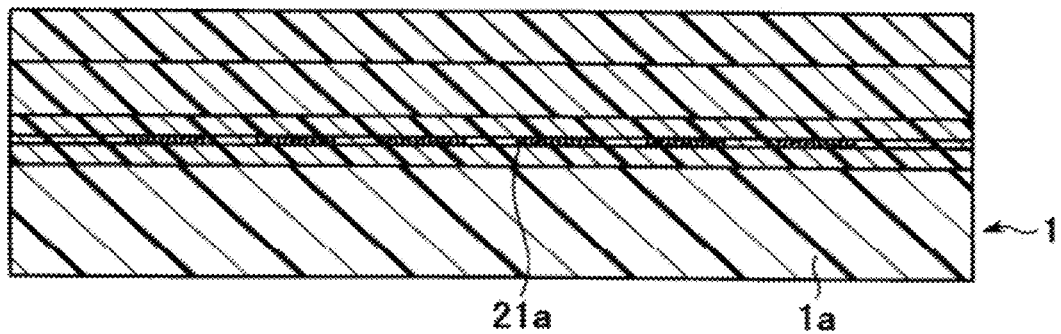

FIG. 1A is a plan view of a pseudo SOC wafer according to an embodiment, and FIG. 1B and FIG. 1C are cross-sectional views of the pseudo SOC wafer according to the embodiment.

FIG. 1B and FIG. 1C are sectional views respectively taken along the lines B-B and C-C depicted in FIG. 1A.

A plurality of semiconductor chips 1b and 1c, and the like, arranged side by side in the in-plane direction of a resin substrate 1a are sealed in the resin substrate 1a, so that a reconstructed wafer 1 is formed. In the reconstructed wafer 1, a plurality of semiconductor chips (for example, logic and memory chips) to be collected as one unit are arranged close to each other, and the plurality of units are arranged in a matrix form. After completion of a pseudo SOC wafer, the units are separated from each other, so that each product is formed.

FIG. 1A to FIG. 1C (and FIG. 2A to FIG. 2V, FIG. 3A, FIG. 3B described below) illustrate a region in the vicinity of one unit, and a case where one unit Un is formed by two semiconductor chips 1b and 1c.

A rewiring layer 21 is formed on the reconstructed wafer 1. The rewiring layer 21 includes a wiring portion 21a for electrically connecting the semiconductor chips 1b and 1c to each other, and a lead-out wiring portion to the outside.

As depicted in the plan view of FIG. 1A, in this example, a plurality of wirings 21a for electrically connecting the semiconductor chip 1b and 1c to each other are arranged in parallel with each other. FIG. 1B is a cross-sectional view taken along the lengthwise direction of the wiring 21a and a cross-sectional view of the portion passing through the wiring 21a.

FIG. 1C is a cross-sectional view taken along the width direction of the wiring 21a and a cross-sectional view of the portion crossing the wirings 21a.

The wirings 21a are fine wirings formed by a pattern (line and space pattern of 2 μm or less) in which the width of each wiring is 2 μm or less, and in which the space between the wirings adjacent to each other is 2 μm or less. As will be described below, in the present embodiment, fine wirings, such as the wirings 21a, are formed by a damascene method.

Figure 2A:
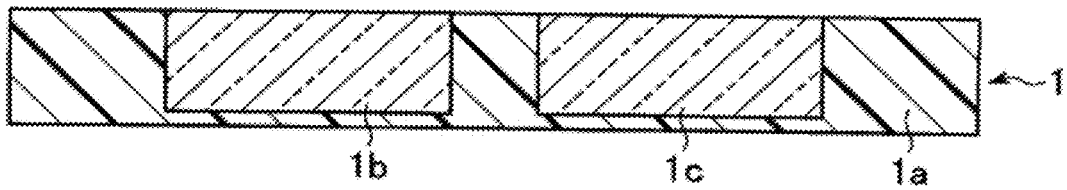
FIG. 2A to FIG. 2D are the schematic sectional views depicting main processes of a manufacturing method of the pseudo SOC wafer according to the embodiment.

Next, a manufacturing method of the pseudo SOC wafer according to the embodiment will be described with reference to FIG. 2A to FIG. 2V, and with reference to FIG. 3A and FIG. 3B. FIG. 2A to FIG. 2V are sectional views each of which is taken along line B-B in FIG. 1A and depicts main processes of the manufacturing method of the pseudo SOC wafer according to the embodiment.

FIG. 2A is referred to. The reconstructed wafer 1 is prepared. The semiconductor chips 1b and 1c are arranged side by side in the in-plane direction of the reconstructed wafer 1 so that the surfaces of the semiconductor chips 1b and 1c, on the surfaces of which terminals are arranged, are exposed. A material of the resin (material of the resin substrate 1a) for sealing the semiconductor chips 1b and 1c is an insulating resin, such as, for example, an acrylate-based resin.

Figure 2B:
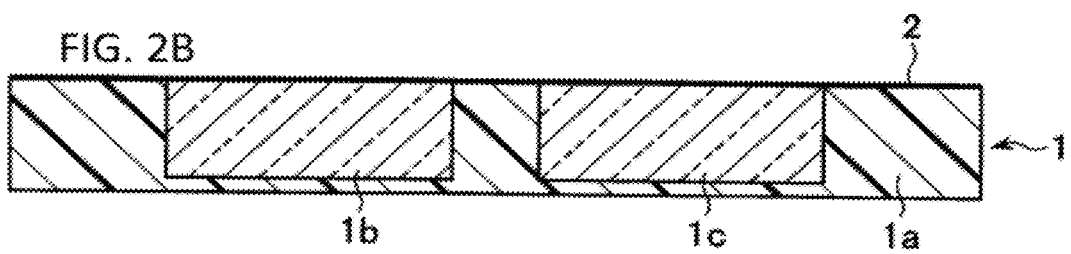

FIG. 2B is referred to. A seed layer 2 is formed on the whole surface of the resin substrate 1. The seed layer 2 is formed, for example, by depositing a Ti layer having a thickness of 20 nm by sputtering, and by depositing, on the Ti layer, a Cu (copper) layer having a thickness of 100 nm by sputtering. The Ti layer has a function of improving the adhesive property between the Cu member formed on the Ti layer and the substrate, and a function of preventing oxidation and diffusion of Cu.

Figure 2C:
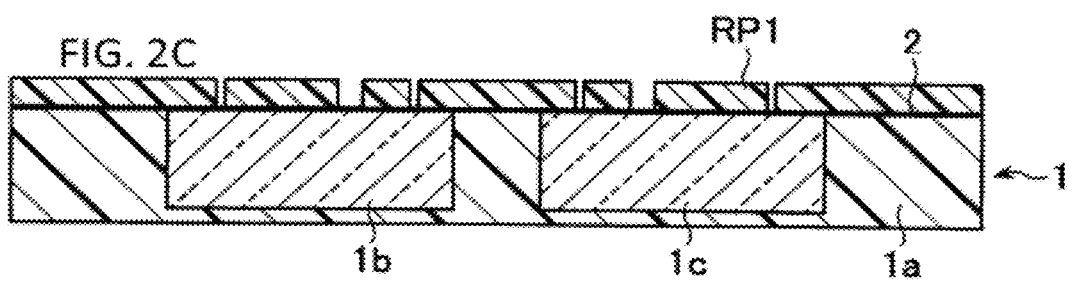

FIG. 2C is referred to. A resist layer having a thickness of, for example, 8 μm is formed by applying resist on the seed layer 2. A resist pattern RP1 is formed by exposing the resist layer and then developing the exposed resist layer with, for example, tetramethylammonium hydroxide (TMA H). The resist pattern RP1 has an opening on each of the terminals of the semiconductor chips 1b and 1c.

Figure 2D:
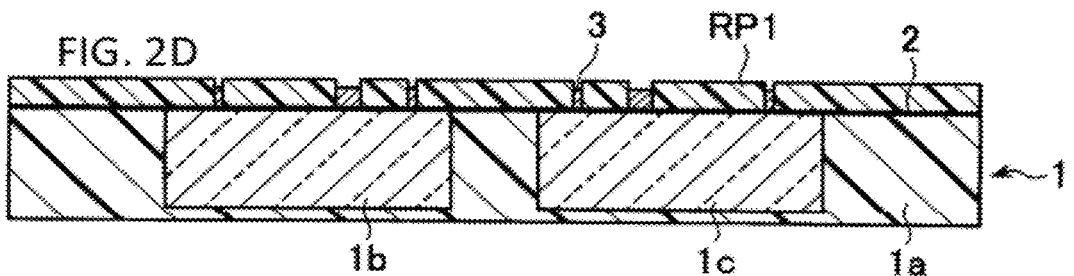

FIG. 2D is referred to. For example, Cu is deposited as a conductive material by electrolytic plating using the seed layer 2 as a power feeding layer, so that a pin 3 is formed in each of the openings of the resist pattern RP1. The plating height of the pin 3 is, for example, 3 μm. Each of the pins 3 is electrically connected to each of the terminals of the semiconductor chips 1b and 1c. Note that the plating height of the pin 3 may be suitably selected according to the design.

FIG. 2E is referred to. The resist pattern RP1 is removed by acetone, or the like. Then, the seed layer 2 outside the pins 3 is removed. The pins 3 are electrically separated from each other. The Cu layer of the seed layer 2 is removed, for example, by wet etching using an etching solution of potassium sulfate. The Ti layer of the seed layer 2 is removed, for example, by wet etching using an ammonium fluoride aqueous solution as an etching solution, or, for example, by dry etching using mixed gas of $CF_4$ and $O_2$ as etching gas.

FIG. 2F is referred to. An insulating layer 4, in which the pins 3 are embedded, is formed in such a manner that phenol-based resin is applied in a thickness of 4 μm by spin coating and is then cured (hardened) at a temperature of 200° C. to 250° C. (for example, 250° C.).

FIG. 2G is referred to. The upper portion of the insulating layer 4 is polished and removed by chemical mechanical polishing (CMP), so that the upper surface of the pins 3 is exposed.

FIG. 2H is referred to. An insulating layer 5 is formed on the insulating layer 4 by applying, for example, a photosensitive phenol-based resin in a thickness 2 μm. In a subsequent process, a wiring 10 is formed in a wiring groove 6 formed in the insulating layer 5. The thickness of the insulating layer 5 may be suitably selected according to the requested thickness of the wiring 10.

FIG. 2I is referred to. A pattern for defining the wiring groove 6 is formed in the insulating layer 5 by exposure and development, and further be cured (hardened), for example, at 250° C. The wiring groove 6 formed in the insulating layer 5 exposes the pins 3. For example, a wiring groove 6a exposes the pin 3 connected to the terminal of the semiconductor chip 1b and also the pin 3 connected to the terminal of the semiconductor chip 1c. The wiring 21a formed in the wiring groove 6a by a subsequent process electrically connects the semiconductor chips 1b and 1c to each other.

FIG. 2J is referred to. A seed layer 7 is formed on the insulating layer 5 so as to cover the inner surface of the wiring groove 6. The seed layer 7 is formed, for example, similarly to the seed layer 2.

FIG. 2K is referred to. A resist layer RL2 is formed on the seed layer 7 by applying resist to a thickness of 8 μm. The thickness of the resist layer RL2 may be set such that Cu deposited by plating in a subsequent process depicted in FIG. 2M is prevented from overflowing onto the upper surface of the resist layer RL2.

FIG. 2L is referred to. The resist layer RL2 is exposed and is then developed, for example, by TMAH, so that a resist pattern (mask pattern) RP2 is formed. The resist pattern RP2 has a wiring formation opening 8a which exposes the wiring groove 6, and a dummy formation opening 8b which is arranged outside the wiring formation opening 8a and which does not expose the wiring groove 6.

Figure 2M:
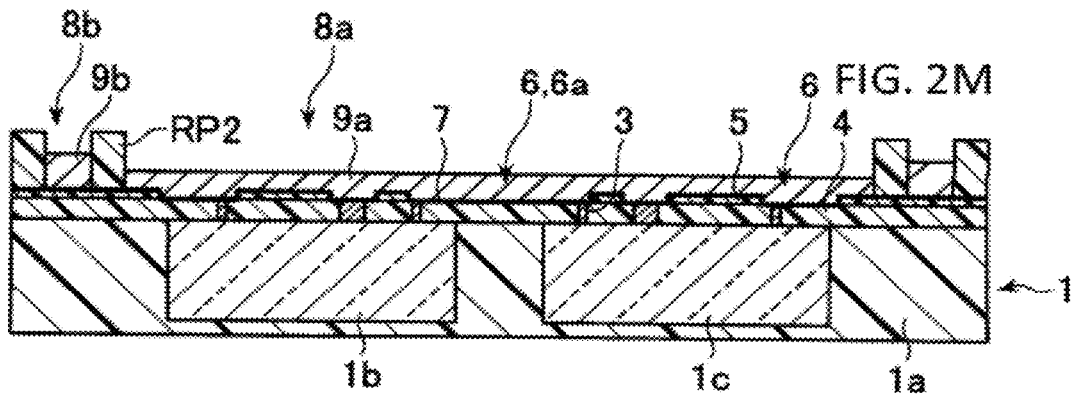
FIG. 2M to FIG. 2P are schematic sectional views depicting main processes of the manufacturing method of the pseudo SOC wafer according to the embodiment.

FIG. 2M is referred to. For example, Cu is deposited, as a conductive material, in the wiring formation opening 8a and the dummy formation opening 8b by electrolytic plating using the seed layer 7 as a power feeding layer. In the wiring formation opening 8a, the conductive material is filled in the wiring groove 6, and is further deposited on the upper surface of the insulating layer 5, so that a wiring conductive member 9a is formed. The wiring conductive member 9a is electrically connected to the pin 3 in the wiring groove 6. In the dummy formation opening 8b, the conductive material is deposited on the insulating layer 5, so that a dummy conductive member 9b is formed.

The plating is performed so that the plating height of the wiring conductive member 9a on the upper surface of the insulating layer 5 is set to, for example, 3 μm. When the plating height of the wiring conductive member 9a is set to, for example, 3 μm, the plating height of the dummy conductive member 9b on the upper surface of the insulating layer 5 is set to, for example, about 3.5 μm. As will be described below, it is preferred that the upper surface of the dummy conductive member 9b is higher than the upper surface of the wiring conductive member 9b.

Figure 2N:
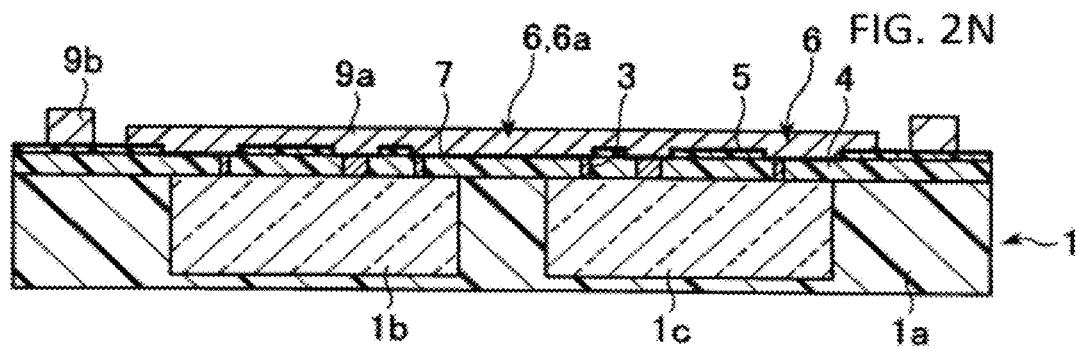

FIG. 2N is referred to. The resist pattern RP2 is removed by acetone, or the like. Then, the grains of the Cu film formed by the plating are grown by performing annealing, for example, at 150° C. for 2 minutes, so that the quality of the Cu film is stabilized. As desirable conditions of annealing which promotes such self-annealing after the plating, it is preferred in particular that the annealing is performed in an environment of a low oxygen concentration at 120° C. to 200° C. for 1 minute to 10 minutes, but the annealing may also be performed in the atmosphere. Note that, when the plating film thickness is, for example, 3 μm, the grains are grown by the self-annealing even at the room temperature (20° C. to 25° C.) in about 24 hours.

Figure 2O:
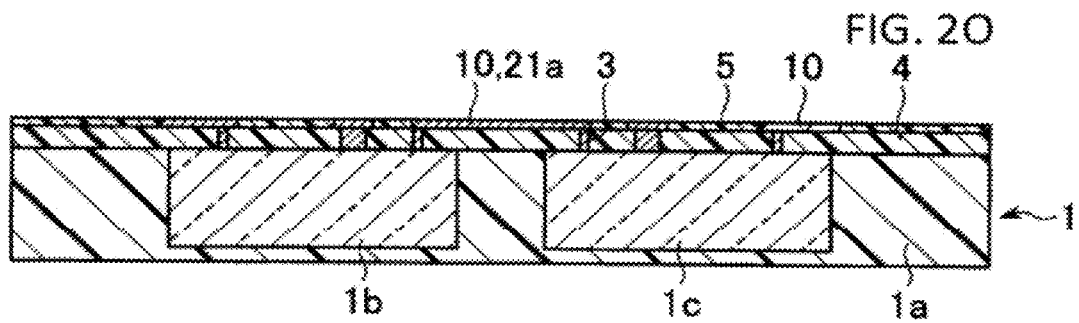

FIG. 2O is referred to. The wiring conductive member 9a and the dummy conductive member 9b on the upper surface of the insulating layer 5 are polished and removed by CMP. The wiring conductive member 9a filled in the wiring groove 6 of the insulating layer 5 is left, so that the wiring 10 is formed. The seed layer 7 outside the wiring 10 is also removed by the CMP, so that the wirings 10 are electrically separated from each other. The wiring 10 which electrically connects the semiconductor chips 1b and 1c to each other is particularly referred to as the wiring 21a. In this way, the copper wiring 10 may be formed by the damascene method. Note that here, the copper wiring includes a wiring formed of a conductive material in which other elements are added to copper as requested.

Figure 3A:
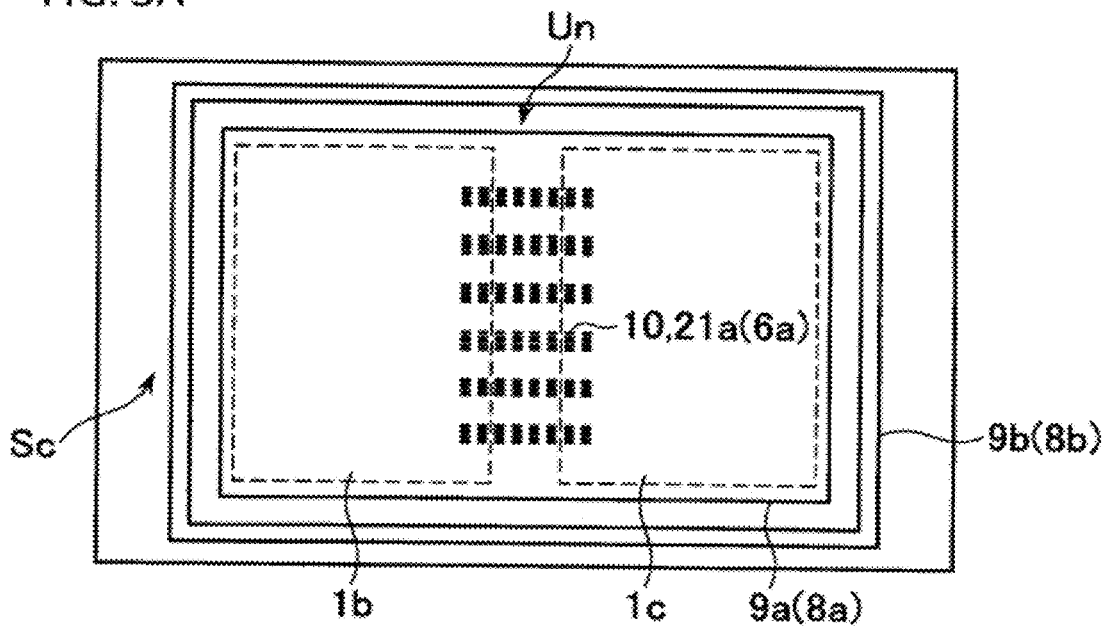
FIG. 3A and FIG. 3B are schematic plan views of the pseudo SOC wafer according to the embodiment, in which a wiring conductive member and a dummy conductive member are formed.

FIG. 3A is a schematic plan view of a pseudo SOC wafer in the stage in which the wiring conductive member 9a and the dummy conductive member 9b are formed. As the wirings 10 formed by the damascene method, the wirings 21a for connecting the semiconductor chips 1b and 1c to each other are typically depicted (by broken lines).

Note that the contours of the wiring conductive member 9a and the dummy conductive member 9b respectively correspond to the opening shapes of the wiring formation opening 8a and the dummy formation opening 8b of the resist pattern RP2. The contour of the wiring 21a corresponds to the shape of the wiring groove 6a.

The opening of the wiring formation opening 8a covers the semiconductor chips 1b and 1c, and has a shape which includes the wiring grooves of the wiring regions formed by the damascene method. As an example of the shape of the dummy formation opening 8b, a groove-shaped opening is depicted in FIG. 3A. The dummy formation opening 8b is arranged outside the wiring formation opening 8a, and surrounds the wiring formation opening 8a in a ring-shaped manner. The dummy formation opening 8b is arranged outside the semiconductor chips 1b and 1c.

The region inside the unit region Un (the region inside the semiconductor chips 1b and 1c, and the region between the semiconductor chips 1b and 1c in this example) is to be secured as an arrangement region of the wiring 10 formed by the damascene method. For this reason, the dummy conductive member 9b is arranged in a scribe region Sc outside the unit region Un (outside the semiconductor chips 1b and 1c in this example), or in a scribe region Sc between the unit regions Un adjacent to each other.

Here, there is described the advantage provided by the dummy conductive member 9b which is already formed at the time when the wiring conductive member 9a on the upper surface of the insulating layer 5 is polished and removed by CMP so as to leave the wiring 10.

First, a comparison example in which the dummy conductive member 9b is not formed is considered. Generally, the polishing by CMP tends to advance easily in the outer peripheral portion of the projecting section to be polished. In this comparison example, the outer peripheral portion of the wiring conductive member 9a is easily polished. As a result, the wirings 10 on the side of the outer peripheral portion of the wiring conductive member 9a are more easily polished, and hence the dishing is easily caused.

In the present embodiment, the dummy conductive member 9b higher than the wiring conductive member 9a is formed outside the wiring conductive member 9a. Thereby, the upper portion of the dummy conductive member 9b is first polished, and hence the outer peripheral portion of the wiring conductive member 9a is hardly polished. Therefore, it is possible to suppress the dishing that the height of the upper surface of the wirings 10 is varied.

Note that it is preferred that the dummy conductive member 9b is formed to be higher than the wiring conductive member 9a. However, in the case where the dummy conductive member 9b is arranged, even when the dummy conductive member 9b is lower than the wiring conductive member 9a, the effect of suppressing the excessive polishing of the outer peripheral portion of the wiring conductive member 9a is expected as compared with the case where the dummy conductive member 9b is not arranged.

In the case where the dummy conductive member 9b and the wiring conductive member 9a are simultaneously formed by electrolytic plating, the followings are considered as a general guideline for forming the dummy conductive member 9b higher than the wiring conductive member 9a. When the area of the surface exposed at the bottom of the dummy formation opening 8b is made smaller than the area of the surface exposed at the bottom of the wiring formation opening 8a, a plating film may be grown thicker in the dummy formation opening 8b than in the wiring formation opening 8a, and thereby the dummy conductive member 9b higher than the wiring conductive member 9a may be formed.

However, it was found that, when the wiring formation opening 8a is excessively narrowed, it is difficult to form the dummy conductive member 9b higher than the wiring conductive member 9a. A suitable dimension of the wiring formation opening 8a will be described along with the second experiment described below.

Figure 3B:
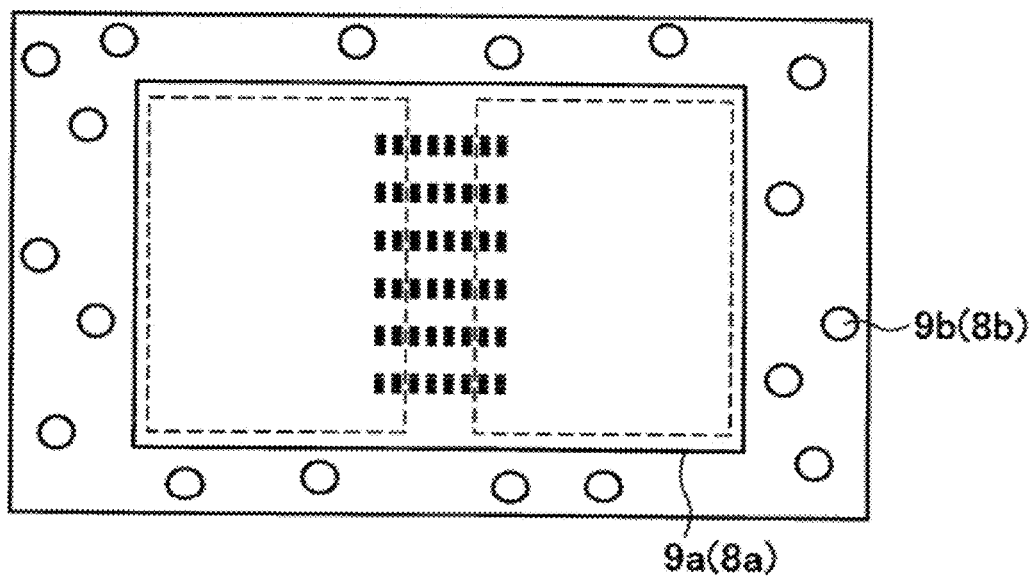

As depicted in FIG. 3B, the dummy conductive member 9b may not be the planar closed ring shape. FIG. 3B depicts an example in which a plurality of columnar dummy conductive members 9b are distributed at random so as to surround the wiring conductive member 9a. Note that the shape of the dummy conductive member 9b is not limited to the columnar shape (the shape of the hole of the dummy formation opening 8b is not limited to the columnar shape).

As depicted in FIG. 3A, the wiring conductive member 9a is arranged for each of the unit region Un of the pseudo SOC wafer. That is, the Cu layer forming the wiring conductive member 9a is divided and arranged for each of the unit regions Un without covering the whole surface of the wafer.

When the Cu layer is formed on the whole surface of the resin substrate 1a of the pseudo SOC wafer, the wafer is warped due to the fact that the thermal expansion coefficient and Young's modulus of the material of the resin substrate are both lower than those of the Cu layer, and thereby a crack, and the like, is caused in the wiring formed by the Cu layer. Note that the thermal expansion coefficient and Young's modulus of Cu are 13 ppm/K and 130 GPa, respectively.

In the present embodiment, the wiring conductive member 9a is formed by dividing, for each unit, the region in which the wiring is formed by the damascene method, and hence the problem due to the above described warp may be suppressed. However, since the wiring conductive members 9a are distributed and arranged, the outer peripheral portion of each of the wiring conductive members 9a tends to be easily polished. The dummy conductive member 9b may suppress the problem that the outer peripheral portion of the wiring conductive member 9a is easily polished.

Figure 2P:
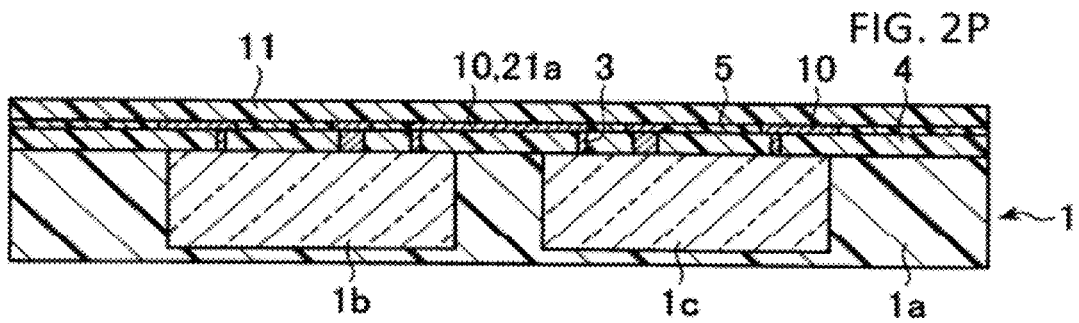

The manufacturing process is further described with reference to FIG. 2P. For example, a photosensitive phenol-based resin is applied to a thickness of 5 µm by spin coating to form an insulating layer 11.

Figure 2Q:
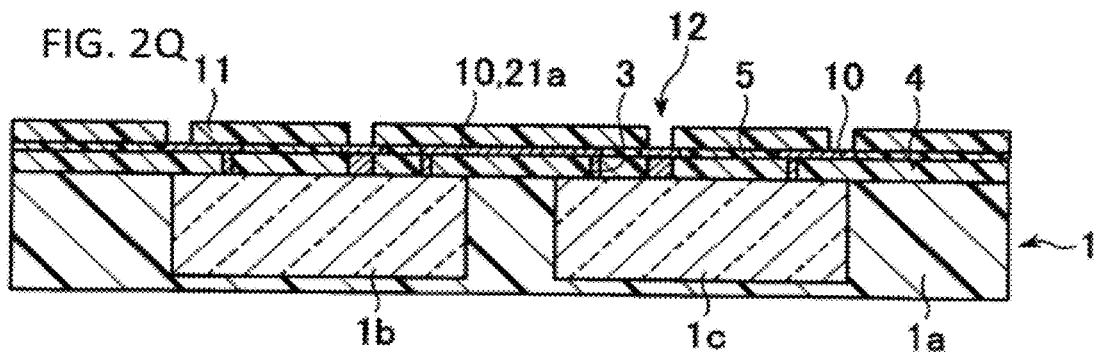
FIG. 2Q to FIG. 2S are schematic sectional views depicting main processes of the manufacturing method of the pseudo SOC wafer according to the embodiment.

FIG. 2Q is referred to. A pattern for defining via holes 12 is formed in the insulating layer 11 by exposure and development, and further, the insulating layer 11 is cured (hardened) at 250° C. The wirings 10 are exposed by the via holes 12.

Figure 2R:
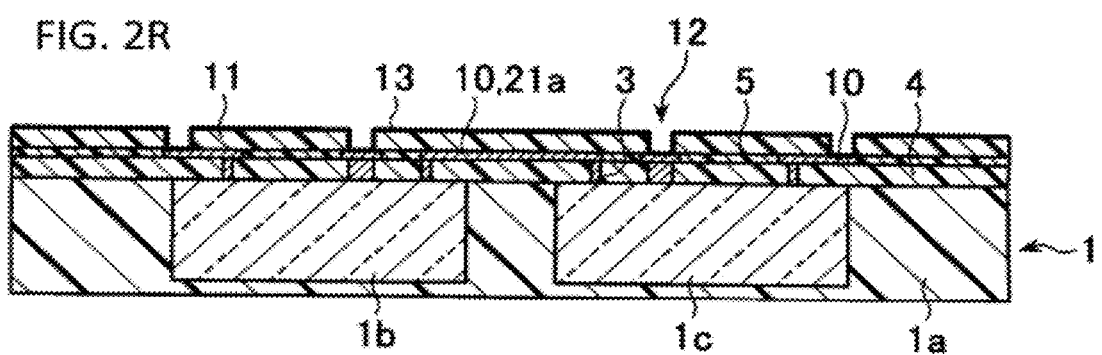

FIG. 2R is referred to. A seed layer 13 is formed on the insulating layer 11 so as to cover the inner surface of the via holes 12. The seed layer 13 is formed, for example, similarly to the seed layer 2.

Figure 2S:
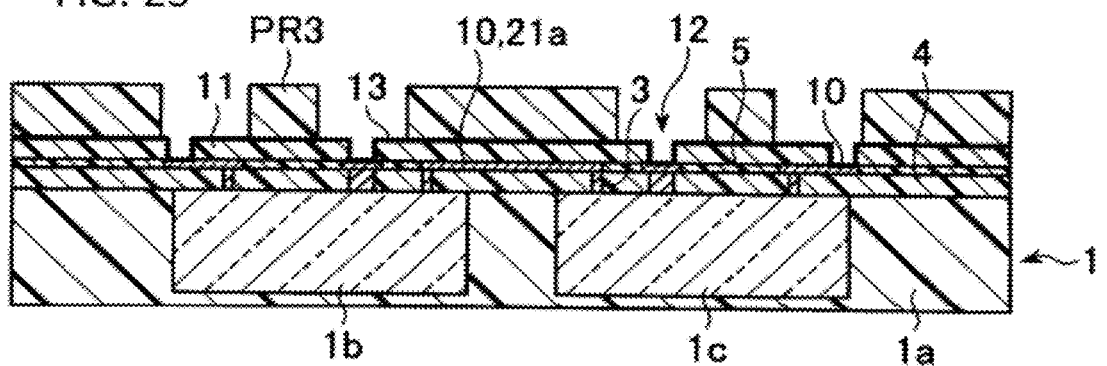

FIG. 2S is referred to. A resist layer is formed by applying resist on the seed layer 13. The resist layer is exposed, and is then developed, for example, by TMAH, so that a resist pattern RP3 is formed. The resist pattern RP3 has an opening having a planar shape including each of the via holes 12.

Figure 2T:
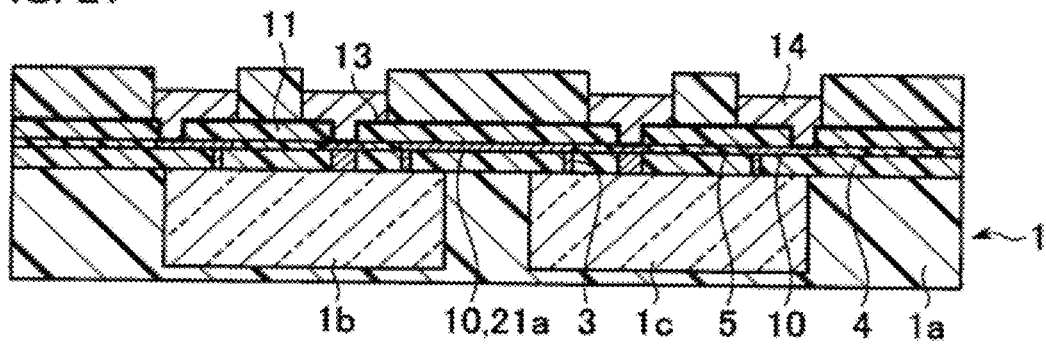
FIG. 2T to FIG. 2V are schematic sectional views depicting main processes of the manufacturing method of the pseudo SOC wafer according to the embodiment.

FIG. 2T is referred to. For example, Cu is deposited as a conductive material in each of the openings of the resist pattern RP3 by electrolytic plating using the seed layer 13 as a power feeding layer. The conductive material is filled in the via holes 12 and further deposited on the upper surface of the insulating layer 11, so that a wiring 14 is formed. The wiring 14 is electrically connected to the wirings 10.

Figure 2U:
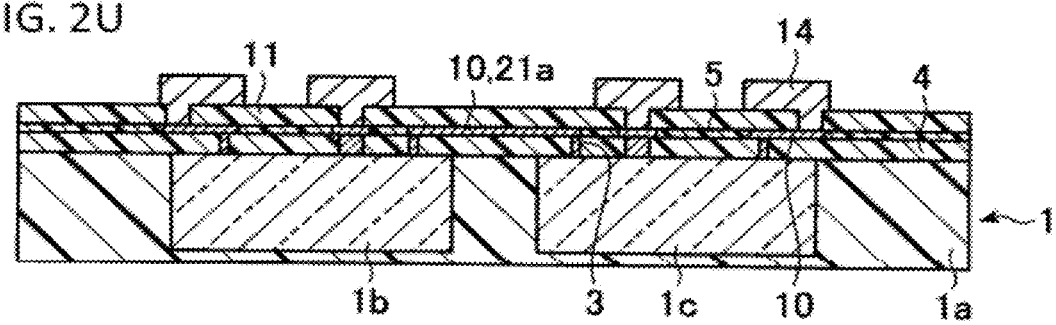
Figure 2V:
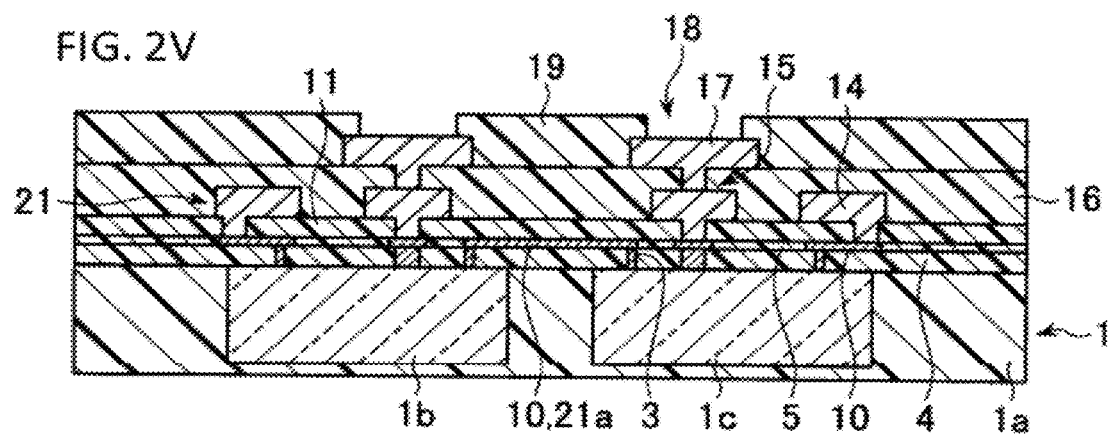

FIG. 2U is referred to. The resist pattern RP3 is removed by acetone, or the like. Then, the seed layer 13 outside the wiring 14 is removed similarly to the removal of the seed layer 2. The wirings 14 are electrically separated from each other.

FIG. 2V is referred to. For example, photosensitive phenol-based resin is applied on the insulating layer 11 so as to cover the wirings 14. The photosensitive phenol-based resin is then exposed and developed, and is further cured (hardened), for example, at 250° C., so that an insulating layer 16 having via holes 15 is formed. Each of the via holes 15 is formed on the upper surface of each of the wirings 14.

Next, a wiring 17 is formed on each of the via holes 15, similarly to the process of forming the wirings 14, which process is described with reference to FIG. 2R to FIG. 2U.

Then, an insulating layer 19 having a contact window 18 opened on the upper surface of each of the wirings 17 is formed similarly to the process of forming the insulating layer 16.

In this way, the pseudo SOC wafer according to the embodiment is formed. The pin 3, the wiring 10, the wiring 14, and the wiring 17, which are formed on the reconstructed wafer 1, are collectively referred to as the rewiring layer 21. In the present embodiment, the semi-additive method is used to form the pin 3, the wiring 14, and the wiring 17, and the damascene method is used to form the wiring 10.

As described above, when the wiring 10 is formed by the damascene method, the polishing/removing process is performed in the state where the dummy conductive member 9b is formed around the wiring conductive member 9a including the wiring 10 to be left. Thereby, it is possible to suppress the variation in the height of the upper surface of the wiring 10 left after the polishing/removing process.

Next, there will be described the first experiment in which the dishing suppressing effect, and the like, provided by the dummy conductive member was studied.

Figure 4A:
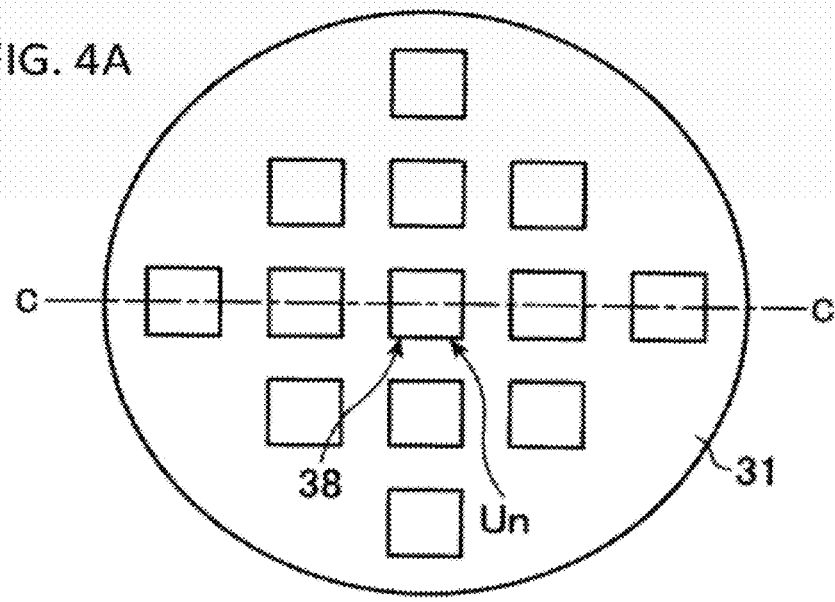
FIG. 4A and FIG. 4B are schematic plan views of a sample in a first experiment.
Figure 4B:
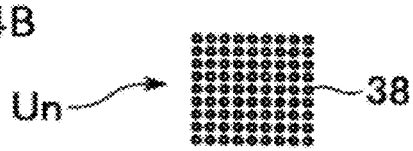
Figure 4C:
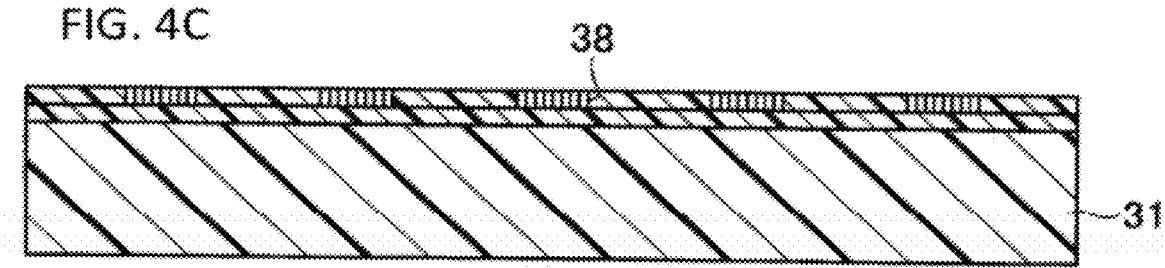
FIG. 4C is a schematic sectional view of the sample in the first experiment.

First, a schematic structure of a model sample formed in the first experiment is described with reference to FIG. 4A to FIG. 4C. FIG. 4A and FIG. 4B are schematic plan views of a model sample, and FIG. 4C is a schematic sectional view taken along the line C-C in the plan view of FIG. 4A.

Conductive members 38 are formed above a resin substrate 31. The resin substrate 31 has a circular shape having a diameter of about 150 mm (6 inches), and is made of epoxy resin containing a filler. The resin substrate 31, in which no semiconductor chip is embedded, corresponds to a reconstructed wafer of a pseudo SOC wafer.

As depicted in FIG. 4A, thirteen unit regions Un are arranged side by side on the surface of the substrate. The unit region Un corresponds to the unit region of the pseudo SOC wafer. Each of the unit regions Un has a square shape of 10 mm square.

As depicted in FIG. 4B, the conductive members 38 are arranged in a matrix form in each of the unit regions Un. The conductive members 38 correspond, for example, to the wirings for connecting the adjacent semiconductor chips to each other in the unit region of the pseudo SOC wafer, and are formed by the damascene method. Each of the conductive members 38 has a columnar shape having a diameter of 100 µm, and about 2500 conductive members 38 are arranged in the unit region Un.

Note that, for the sake of simplicity of illustration, the conductive members 38 are depicted in FIG. 4A without being distinguished from each other. In FIG. 4B, eighty-one conductive members (9 rows×9 columns) are illustrated as the conductive members 38 arranged in the unit region Un. In FIG. 4C, the conductive members 38 of nine rows for one unit are depicted.

Next, a manufacturing method of the model sample of the first experiment will be described with reference to FIG. 5A to FIG. 5F. FIG. 5A to FIG. 5F are sectional views taken along the line C-C in FIG. 4A, which depict main processes of a manufacturing method of the model sample and depict the vicinity of one of the unit regions Un.

Figure 5A:
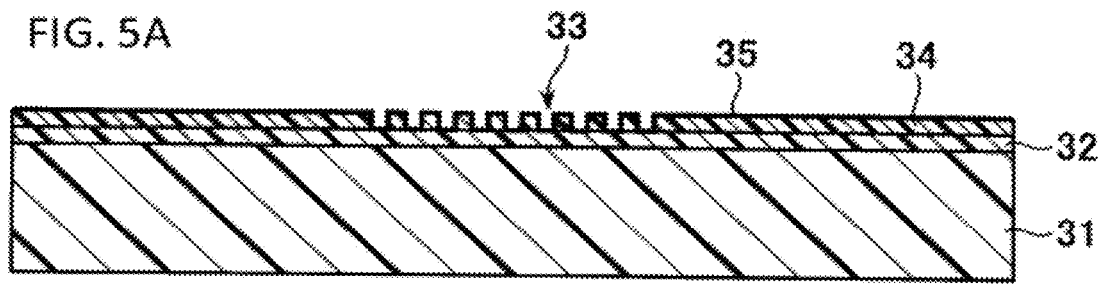
FIG. 5A to FIG. 5C are schematic sectional views depicting main processes of a manufacturing method of the sample in the first experiment.

FIG. 5A is referred to. Phenol-based resin is applied on the resin substrate 31 to a thickness of 5 µm and is then cured (hardened) at 250° C., so that an insulating layer 32 is formed. Then, photosensitive phenol-based resin is applied on the insulating layer 32 to a thickness of 5 µm. A pattern for defining recessed sections 33 is formed by exposing and developing the applied resin, and is then cured at 250° C., so that an insulating layer 34 is formed.

A seed layer 35 is formed on the insulating layer 34 so as to cover the inner surface of the recessed sections 33. The seed layer 35 is formed in such a manner that a Ti layer is deposited in a thickness of 20 nm on the insulating layer 34 by sputtering, and that a Cu layer is deposited in a thickness of 100 nm on the Ti layer by sputtering.

Figure 5B:
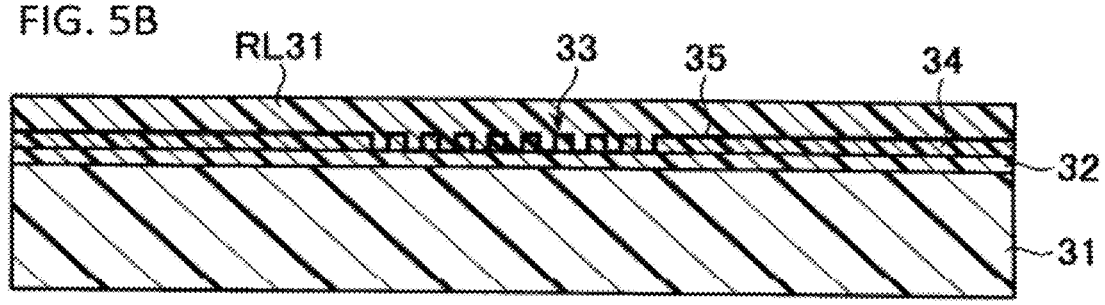

FIG. 5B is referred to. A resist is applied on the seed layer 35 to a thickness of 5 µm (as a thickness on the upper surface of the insulating layer 34), so that a resist layer RL31 is formed.

Figure 5C:
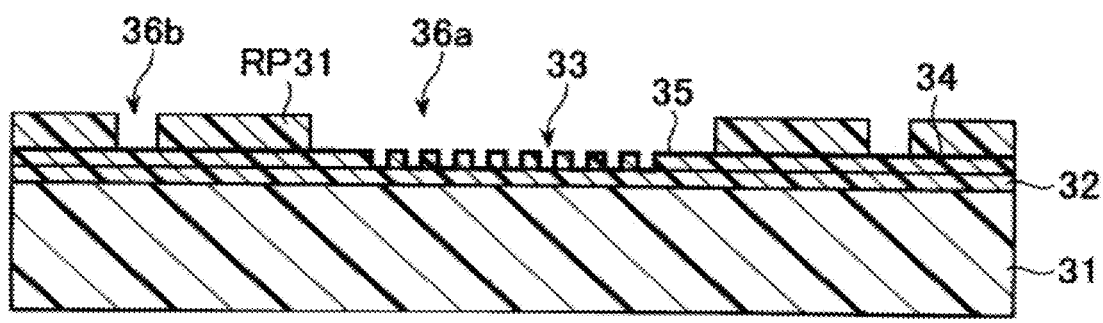

FIG. 5C is referred to. The resist layer RL31 is exposed and developed, so that a resist pattern RP31 is formed. The resist pattern RP31 has a conductive member formation opening 36a, and a dummy formation opening 36b. The conductive member formation opening 36a has a shape including all the recessed sections 33 in the unit region Un and has a width of 10 mm.

Figure 6A:
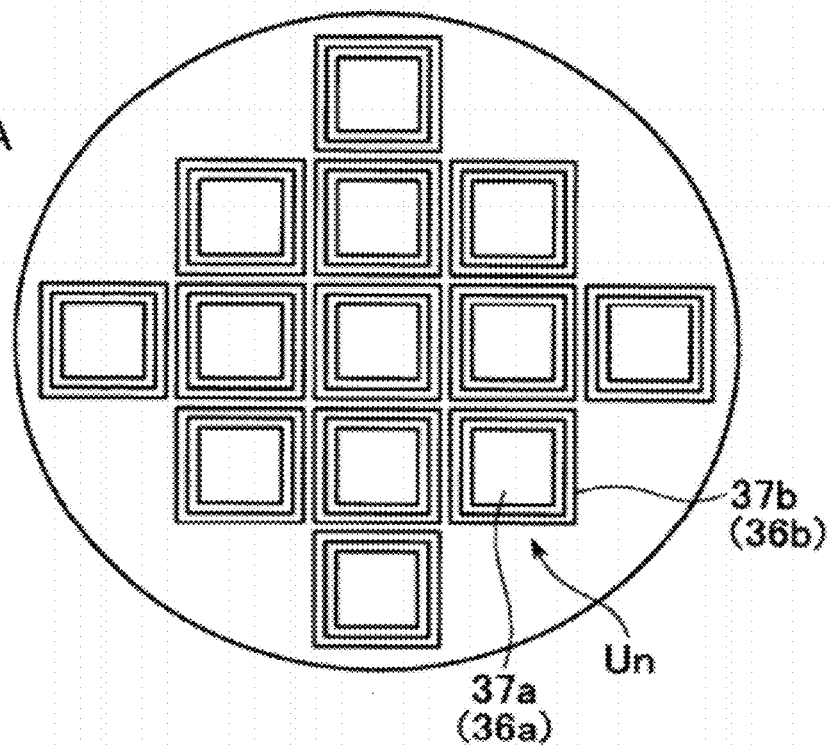
FIG. 6A and FIG. 6B are schematic plan views of the samples in the first experiment.
Figure 6B:
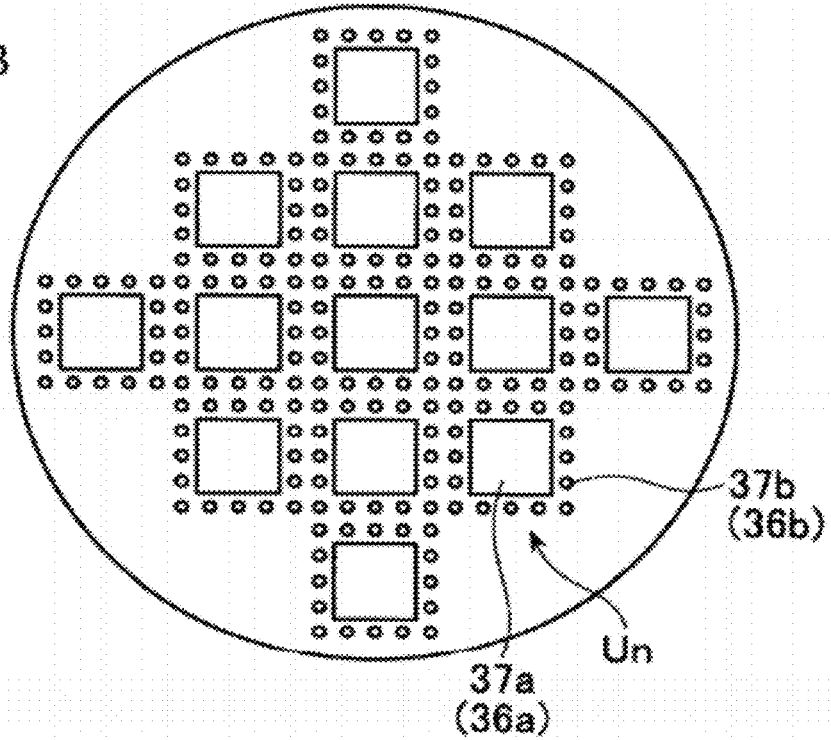

The dummy formation opening 36b is arranged outside the conductive member formation opening 36a. The dummy formation opening 36b defines groove-shaped recessed sections in the resist pattern RP31 used at the time of forming dummy conductive members 37b each having a linear shape as depicted in FIG. 6A described below. The dummy formation opening 36b defines hole-shaped recessed sections in the resist pattern RP31 used at the time of forming columnar dummy conductive members 37b as depicted in FIG. 6B described below.

FIG. 5D is referred to. A conductive member 37a and the dummy conductive member 37b are respectively formed in the conductive member formation opening 36a and the dummy formation opening 36b by depositing Cu by electrolytic plating using the seed layer 35 as a power feeding layer. The plating height of the conductive member 37a on the upper surface of the insulating layer 34 is 3 µm.

FIG. 5E is referred to. The resist pattern RP31 is removed by acetone, or the like. Then, annealing is performed at 150° C. for two minutes.

FIG. 5F is referred to. The conductive member 37a and the dummy conductive member 37b on the upper surface of the insulating layer 34 are polished and removed by CMP. The recessed section 33 in the conductive member 37a is left, so that the conductive member 38 is formed.

In the first experiment, the dishing suppressing effect, and the like, was evaluated by changing the shape of the dummy conductive member 37b.

FIG. 6A and FIG. 6B are schematic plan views respectively depicting the shapes of the dummy conductive member 37b in the first experiment. FIG. 6A and FIG. 6B depict the states where the conductive member 37a and the dummy conductive member 37b are formed. Note that the contours of the conductive member 37a and the dummy conductive member 37b respectively correspond to the opening shapes of the conductive member formation opening 36a and the dummy formation opening 36b of the resist pattern RP31.

FIG. 6A depicts the linear dummy conductive member 37b. In each of the unit regions Un, the four linear dummy conductive members 37b are arranged in a ring-shape so as to surround the conductive member 37a.

FIG. 6B depicts the columnar dummy conductive member 37b. A plurality of the dummy conductive members 37b are distributed so as to surround the conductive member 37a of each of the unit regions Un. Note that the plurality of dummy conductive members 37b distributed and arranged around the conductive member 37a as in the case of FIG. 6B are also collectively referred to as the dummy conductive member 37b.

There were manufactured four kinds of samples of a first sample in which the linear dummy conductive member 37b having a width of 20 µm was formed, a second sample in which the linear dummy conductive member 37b having a width of 5 µm was formed, a third sample in which the columnar dummy conductive member 37b having a diameter of 70 µm was formed, and a fourth sample in which the columnar dummy conductive member 37b having a diameter of 5 µm was formed. Along with the four samples, two kinds of comparison samples were manufactured.

FIG. 6C and FIG. 6D are schematic plan views respectively depicting the comparison samples. FIG. 6C depicts the first comparison sample. The first comparison sample is a sample in which the Cu layer 37a is formed on the whole surface of the substrate without using a mask pattern in the plating process of forming the conductive member 37a. FIG. 6D depicts the second comparison sample. In the second comparison sample, the dummy conductive member 37b is not formed, and only the conductive members 37a are formed so as to be divided for each of the unit regions Un.

Figure 7A:
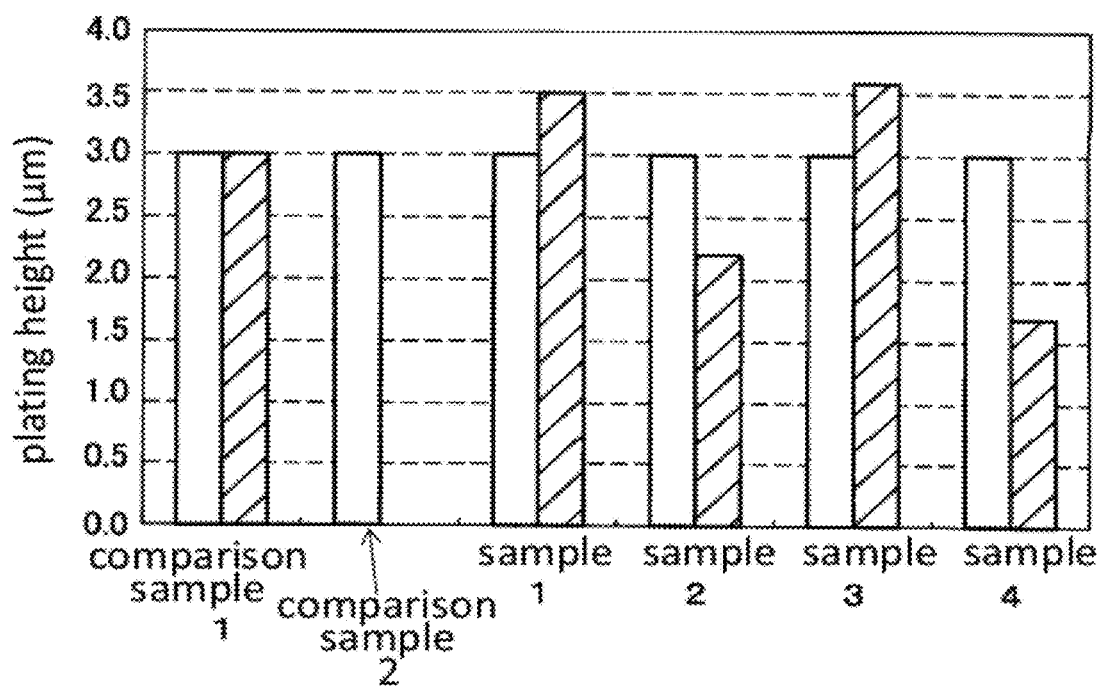
FIG. 7A depicts a graph summarizing the plating height of the samples and the comparison samples in the first experiment.

FIG. 7A depicts a graph summarizing the plating height of the first to fourth samples, and the plating height of the first and second comparison samples. In each of the samples, the plating height of the conductive member 37a (the plating height of the wiring formation region formed by the damascene method) is depicted on the left side, and the plating height of the dummy conductive member 37b (the plating height of the scribe region) is depicted on the right side.

In each of the samples, the plating height of the conductive member 37a is equally set to 3.0 µm. In the first comparison sample (on the whole surface of which the Cu layer is formed), the thickness of 3.0 µm of the Cu layer may be treated as the plating height of the dummy conductive member 37b. In the second comparison sample (without the dummy conductive member), the plating height of the dummy conductive member 37b is 0.0 µm.

The plating height of the dummy conductive member 37b was 3.5 µm in the first sample (having the linear shape and the width of 20 µm), 2.2 µm in the second sample (having the linear shape and the width of 5 µm), 3.6 µm in the third sample (having the columnar shape and the diameter of 70 µm), and 1.7 µm in the fourth sample (having the columnar shape and the diameter of 5 µm).

In the first sample (having the linear shape and the width of 20 µm) and the third sample (having the columnar shape and the diameter of 70 µm), the dummy conductive member 37b higher than the conductive member 37a is formed. In the second sample (having the linear shape and the width of 5 µm) and the fourth sample (having the columnar shape and the diameter of 5 µm), the dummy conductive member 37b lower than conductive member 37a is formed.

Figure 7B:
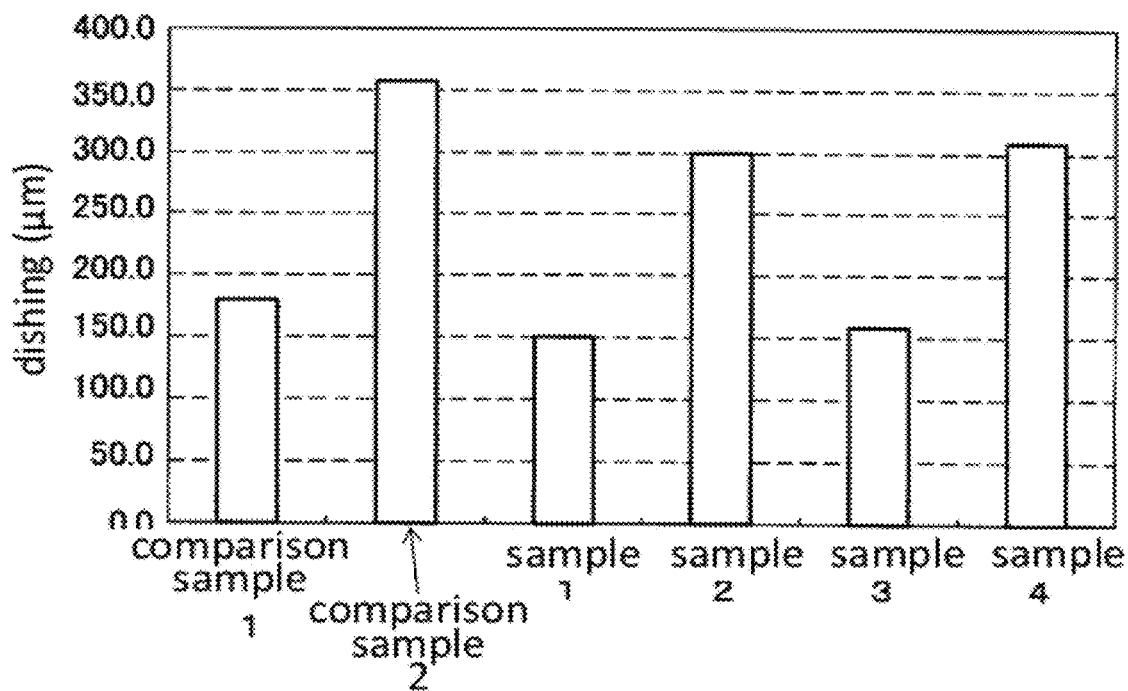
FIG. 7B depicts a graph summarizing the dishing amount of the conductive member in the first experiment.

FIG. 7B depicts a graph summarizing the dishing amount of the conductive member 38 left after the application of CMP to the first to fourth samples, and to the first and second comparison samples. The dishing amount of the conductive member 38 arranged at the outermost periphery of the unit region was measured.

The dishing amount was 180 nm in the first comparison sample (on the whole surface of which the Cu layer was formed), 360 nm in the second comparison sample (without the dummy conductive member), 150 nm in the first sample (having the linear shape and the width of 20 µm), 300 nm in the second sample (having the linear shape and the width of 5 µm), 160 nm in the third sample (having the columnar shape and the diameter of 70 µm), and 310 nm in the fourth sample (having the columnar shape and the diameter of 5 µm).

It is seen that the dishing is suppressed in the first to fourth samples in which the dummy conductive member 37b is formed, as compared with the second comparison sample (without the dummy conductive member). In the first comparison sample (on the whole surface of which the Cu layer was formed), the substrate tends to be easily warped as described above, but the dishing is hardly caused because the Cu layer is formed on the whole surface of the sample. It is seen that, in the first sample and the third sample in each of which the dummy conductive member 37b higher than the conductive member 37a is formed, the dishing is suppressed to the same extent as in the first comparison sample.

Figure 8:
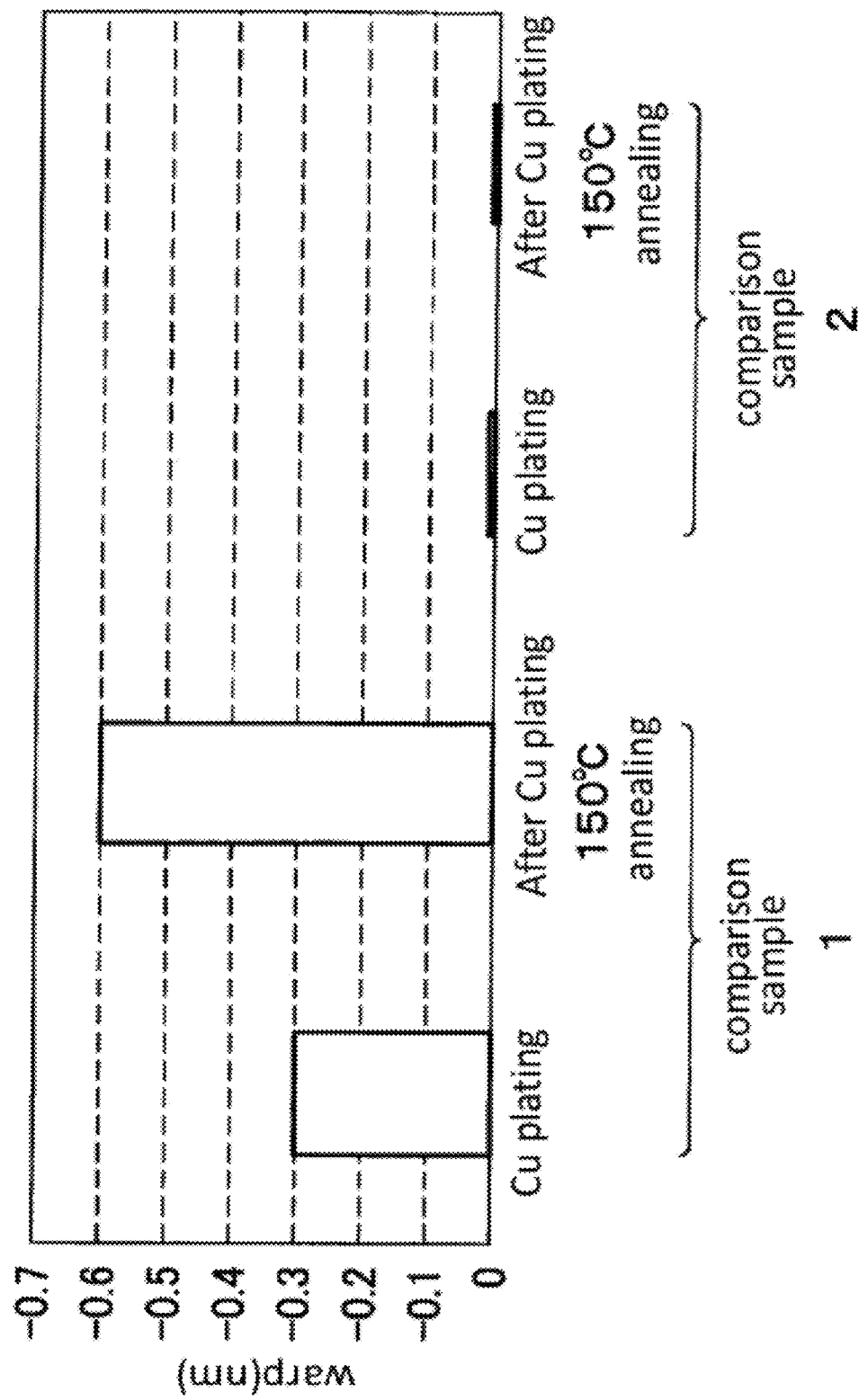
FIG. 8 depicts a graph summarizing the warp of the substrate of the comparison samples in the first experiment.

FIG. 8 depicts a graph summarizing the warp amounts of the substrates of the first and second comparison samples. In the first comparison sample (on the whole surface of which the Cu layer is formed), a warp is caused on the surface side of the Cu layer so that the center portion of the substrate is recessed with respect to the edge portion of the substrate. The warp is estimated by the height difference between the center portion of the substrate and the edge portion of the substrate.

The warp of the first comparison sample (on the whole surface of which the Cu layer is formed) is 0.3 mm at the time of Cu plating, and is increased to 0.6 mm by annealing after the Cu plating. The warp of the second comparison sample (without the dummy conductive member) is 0.01 mm at the time of Cu plating, and is also 0.01 mm after annealing. In the second comparison sample, the warp is suppressed by forming the Cu layer (the conductive member 37a) so as to be divided on the substrate. Also in the first to fourth samples, the warp may be suppressed by the divided Cu layer (the conductive member 37a).

Next, there will be described a second experiment which was performed to study the suitable dimension of the dummy formation opening provided in the mask pattern for forming the dummy conductive member. In the second experiment, the relationship between the dimension of the opening and the plating height was studied by forming openings having various dimensions in a resist layer and by depositing a Cu layer in the openings by electrolytic plating.

A groove-shaped opening corresponding to the linear dummy conductive member as depicted in FIG. 6A, and a hole-shaped opening corresponding to the columnar dummy conductive member as depicted in FIG. 6B were formed. The width of groove-shaped opening was changed to 100 μm, 70 μm, 50 μm, 30 μm, 15 μm, 8 μm, 5 μm, and 2 μm. The diameter of the hole-shaped opening was changed to 100 μm, 70 μm, 50 μm, 40 μm, 30 μm, 20 μm, 10 μm, and 5 μm.

Figure 9A:
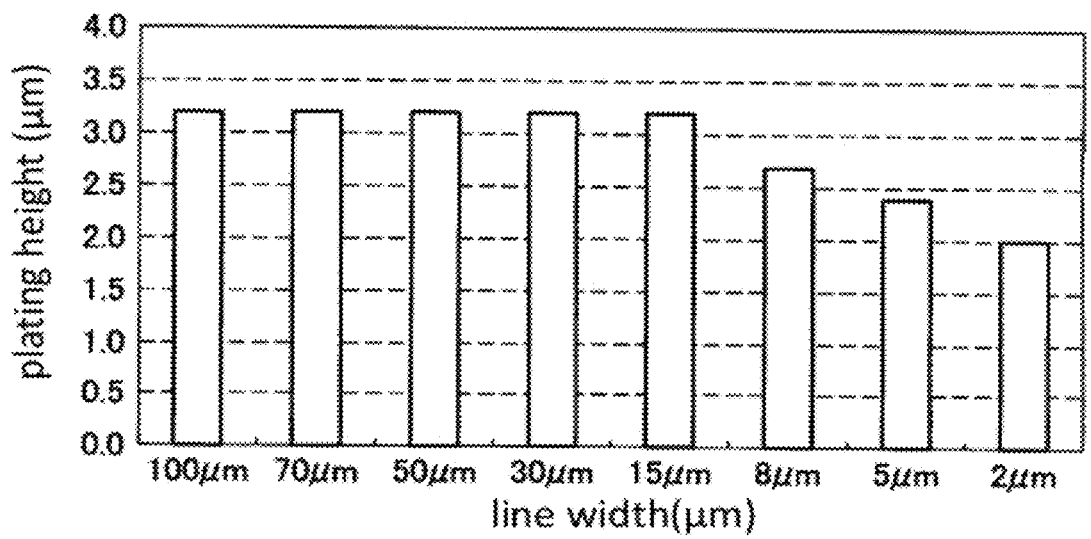
FIG. 9A and FIG. 9B respectively depict a graph depicting a relationship between the width of groove-shaped opening and the plating height in a second experiment, and a graph depicting a relationship between the diameter of hole-shaped opening and the plating height in the second experiment.

FIG. 9A depicts a graph depicting a relationship between the width of the groove-shaped opening and the plating height. As for the groove-shaped opening, it is seen that, when the width is less than 15 μm, the plating height is reduced. From this, it may be said that, when the linear dummy conductive member is formed, the width of the groove-shaped opening is preferably set to 15 μm or more in order to suppress the reduction in the plating height.

Figure 9B:
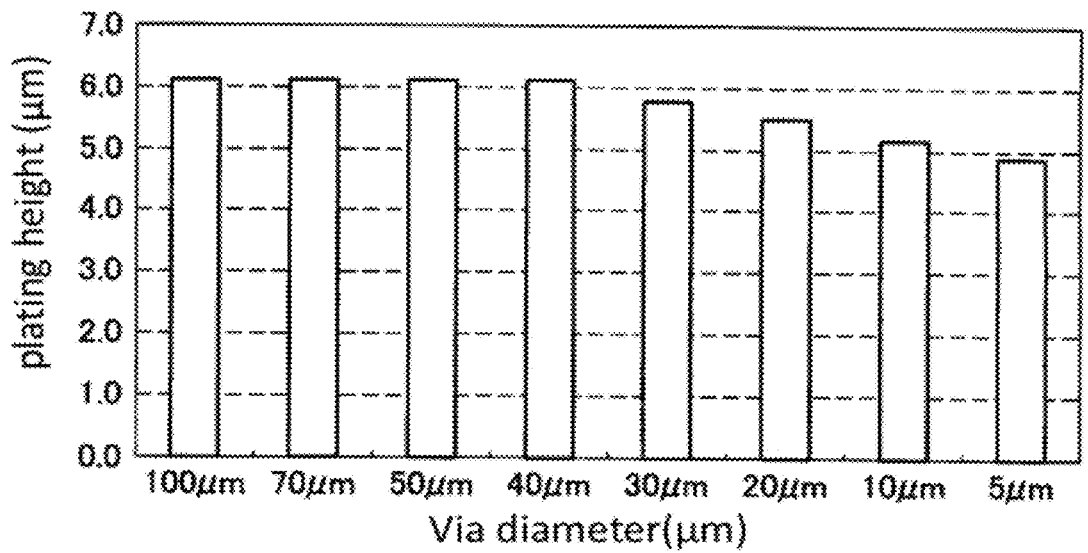

FIG. 9B depicts a graph depicting a relationship between the diameter of the hole-shaped opening and the plating height. As for the hole-shaped opening, it is seen that, when the diameter is less than 40 μm, the plating height is reduced. From this, it may be said that, when the columnar dummy conductive member is formed, the diameter of the hole-shaped opening is preferably set to 40 μm or more in order to suppress the reduction in the plating height.

Note that it is considered that the preferred size of the opening is not limited to the case of Cu and may be applied substantially similarly to the case of conductive materials formed by electrolytic plating.

Next, there will be described the difference in the wiring characteristics which is caused by the difference in the process of forming the wiring. As described above, when the re-wiring of the pseudo SOC wafer is formed by the damascene method, and when a plating layer is formed on the whole surface of the resin substrate, a crack is caused in the wiring due to the warping of the wafer. On the other hand, when plating layers are formed on the resin substrate so as to be divided from each other, the warping is suppressed, and hence the quality of the wiring is improved.

Figure 10A:
FIG. 10A and FIG. 10B respectively depict an SIM image depicting a cross section of a wiring formed by a Cu layer formed on the whole surface of a substrate, and an SIM image depicting a cross section of a wiring formed by a Cu layer divided and formed on a substrate.

FIG. 10A depicts an electron microscope photograph which is taken by a scanning ion microscope (SIM) and which depicts a cross section of a wiring formed in such a manner that a Cu layer is formed on the whole surface of a substrate and that the Cu layer of unrequested portions is polished and removed.

Figure 10B:

FIG. 10B depicts an electron microscope photograph which is taken by the SIM and which depicts a cross section of a wiring formed in such a manner that Cu layers are formed on a substrate so as to be divided from each other and that the Cu layers of unrequested portions are polished and removed.

In both the samples depicted in FIG. 10A and FIG. 10B, after the plating of the Cu layer, annealing is performed to grow Cu grains. The grains are grown from the lower portion toward the upper portion of the wiring.

In the sample of FIG. 10A in which the Cu layer is formed on the whole surface of the substrate, a pattern is observed in which the growth of the grains is stopped at an intermediate thickness to cause the pattern to be divided into a lower layer having grown grains and an upper layer grains that are not grown. In the sample of FIG. 10A, the annealing of the Cu layer is performed in the state where the substrate is warped and stressed. It is considered that this causes the grains to be hardly grown.

On the other hand, in the sample of FIG. 10B in which the Cu layers are formed on the substrate so as to be divided from each other, the grains grown from the lower surface to the upper surface of the Cu layer are observed. It is considered that, since the warping is suppressed by the Cu layers formed to be divided from each other, the stress is reduced, and thereby the grains are easily grown as compared with the sample depicted in FIG. 10A. For example, it is considered that, also in the copper wiring 10 of the above-described embodiment, the grains grown over the whole thickness of the wiring are obtained as in the sample depicted in FIG. 10B.

In the above, the present invention has been described with reference to the embodiment, but the present invention is not limited to the embodiment. For, example, it will be apparent to those skilled in the art that various changes, modifications, combinations, and the like, of the present invention may be made therein without departing from the spirit and scope of the invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A manufacturing method of a semiconductor device, comprising:
    forming an insulating layer above a substrate;
    forming a recessed section in the insulating layer;
    forming, on the insulating layer, a mask pattern having a first opening which exposes the recessed section, and a second opening which is arranged outside the first opening and does not expose the recessed section;

forming a first conductive member and a second conductive member by respectively depositing a conductive material in the first opening and the second opening;

removing the mask pattern after the first and second conductive members have been formed; and polishing and removing the first conductive member and the second conductive member on the upper side of the insulating layer so as to leave the first conductive member in the recessed section.

2. The manufacturing method of a semiconductor device, according to claim 1, wherein a plurality of units, each of which is formed by collecting a plurality of semiconductor chips as a group, are arranged side by side in the in-plane direction of the substrate and embedded in the substrate, wherein the recessed section exposes a conductive member electrically connected to one of the semiconductor chips included in a first unit of the plurality of units, and wherein, after the first conductive member and the second conductive member are polished and removed on the upper side of the insulating layer, the first conductive material left in the recessed section is electrically connected to the one of the semiconductor chips included in the first unit.

3. The manufacturing method of a semiconductor device, according to claim 2, wherein the second opening is arranged outside the semiconductor chips forming the first unit.

4. The manufacturing method of a semiconductor device, according to claim 1, wherein the upper surface of the second conductive member is formed higher than the upper surface of the first conductive member.

5. The manufacturing method of a semiconductor device, according to claim 1, wherein the first conductive member and the second conductive member are simultaneously formed by electrolytic plating.

6. The manufacturing method of a semiconductor device, according to claim 5, wherein the second opening defines a groove-shaped recessed section and has a width of 15 μm or more.

7. The manufacturing method of a semiconductor device, according to claim 5, wherein the second opening defines a hole-shaped recessed section and has a diameter of 40 μm or more.

8. The manufacturing method of a semiconductor device, according claim 1, wherein the second opening defines a groove-shaped recessed section and is arranged in a ring shape surrounding the first opening.

9. The manufacturing method of a semiconductor device, according to claim 1, wherein the second opening defines a hole-shaped recessed section and a plurality of the second openings are arranged so as to be distributed around the first opening.

10. The manufacturing method of a semiconductor device, according to claim 1, wherein a plurality of units, in each of which a plurality of semiconductor chips are collected as a group, are arranged side by side in the in-plane direction of the substrate and embedded in the substrate, and wherein the second opening is arranged in a scribe region between the units adjacent to each other.

11. The manufacturing method of a semiconductor device, according to claim 1, wherein the thermal expansion coefficient and Young's modulus of the material forming the substrate are both lower than the thermal expansion coefficient and Young's modulus of the conductive material.

12. The manufacturing method of a semiconductor device, according to claim 1, further comprising a process of annealing the first conductive member.

* * * * *

UNITED STATES PATENT AND TRADEMARK OFFICE
CERTIFICATE OF CORRECTION

| | | |
|---|---|---|
| PATENT NO. | : 8,691,699 B2 | Page 1 of 1 |
| APPLICATION NO. | : 13/427200 | |
| DATED | : April 8, 2014 | |
| INVENTOR(S) | : Kanki et al. | |

It is certified that error appears in the above-identified patent and that said Letters Patent is hereby corrected as shown below:

In the Claims

Column 14, Line 11, In Claim 8, delete "according claim 1," and insert -- according to claim 1, --, therefor.

Signed and Sealed this
Twelfth Day of August, 2014

Michelle K. Lee
*Deputy Director of the United States Patent and Trademark Office*